US012772686B2

(12) United States Patent
Chao et al.

(10) Patent No.: US 12,772,686 B2
(45) Date of Patent: Oct. 20, 2026

(54) OPTICAL MODULES CONFIGURED TO GENERATE AN ILLUMINATION LIGHT BEAM FROM OVERLAPPING RED/GREEN/BLUE LIGHT SPOTS AND NEAR-EYE DISPLAY USING THE SAME

(71) Applicant: Industrial Technology Research Institute, Hsinchu (TW)

(72) Inventors: Chia-Hsin Chao, Hsinchu County (TW); Ming-Hsien Wu, Tainan City (TW)

(73) Assignee: Industrial Technology Research Institute, Hsinchu (TW)

( * ) Notice: Subject to any disclaimer, the term of this patent is extended or adjusted under 35 U.S.C. 154(b) by 385 days.

(21) Appl. No.: 18/391,666

(22) Filed: Dec. 21, 2023

(65) Prior Publication Data

US 2024/0260366 A1 Aug. 1, 2024

Related U.S. Application Data

(60) Provisional application No. 63/482,302, filed on Jan. 31, 2023.

(30) Foreign Application Priority Data

Dec. 14, 2023 (TW) ................................ 112148654

(51) Int. Cl.
*G02B 27/01* (2006.01)
*F21V 8/00* (2006.01)
(Continued)

(52) U.S. Cl.
CPC ......... *H10K 59/351* (2023.02); *G02B 6/0016* (2013.01); *G02B 6/0036* (2013.01);
(Continued)

(58) Field of Classification Search
CPC .............. G02B 27/0172; G02B 27/017; G02B 27/0174; G02B 6/0016; G02B 6/0036;
(Continued)

(56) References Cited

U.S. PATENT DOCUMENTS 8,998,414 B2 * 4/2015 Bohn ...................... G02B 5/20 351/210
10,175,564 B2 * 1/2019 Yaras ................ G03B 21/2046
(Continued)

FOREIGN PATENT DOCUMENTS

CN 106097899 A * 11/2016 .......... H10K 59/878
CN 111656707 9/2020
(Continued)

OTHER PUBLICATIONS

Machine translation of CN-106097899-A (Year: 2016).*
(Continued)

*Primary Examiner* — Younes Boulghassoul
(74) *Attorney, Agent, or Firm* — JCIPRNET

(57) ABSTRACT

An optical module including a red light emitting chip array, a green light emitting chip array, a blue light emitting chip array, and a flat optical element is provided. The red light emitting chip array is configured to emit red lights. The green light emitting chip array is configured to emit green lights. The blue light emitting chip array is configured to emit blue lights. After passing through the flat optical element, the red, green, and blue lights form a plurality of light spots. Each of the light spots includes a red light spot, a green light spot, and a blue light spot which are formed after one of the red lights, one of the green lights, and one of the blue lights pass through the flat optical element. A near-eye display is also provided.

20 Claims, 13 Drawing Sheets

(51) Int. Cl.
*H10K 59/13* (2023.01)
*H10K 59/131* (2023.01)
*H10K 59/35* (2023.01)
*H10K 59/80* (2023.01)

(52) U.S. Cl.
CPC ......... *G02B 27/0172* (2013.01); *H10K 59/13* (2023.02); *H10K 59/131* (2023.02); *H10K 59/875* (2023.02)

(58) Field of Classification Search
CPC .................. G02B 27/283; G02B 27/30; H10H 29/32–362; H10K 59/35–353; H10K 59/877; H10K 59/878
See application file for complete search history.

(56) References Cited

U.S. PATENT DOCUMENTS

| | | | | |
|---|---|---|---|---|
| 10,274,758 | B1 * | 4/2019 | Liu | G02F 1/025 |
| 10,528,128 | B1 * | 1/2020 | Yoon | H10K 59/878 |
| 10,629,105 | B2 * | 4/2020 | Perreault | G09G 3/001 |
| 11,022,809 | B1 * | 6/2021 | Richards | G02B 27/0093 |
| 12,191,418 | B2 * | 1/2025 | He | H10H 20/821 |
| 12,474,449 | B2 * | 11/2025 | Wei | G01S 17/89 |
| 12,541,105 | B2 * | 2/2026 | Han | G02B 27/0081 |
| 2003/0030371 | A1 * | 2/2003 | Liao | G02F 1/133603 313/506 |
| 2013/0207964 | A1 * | 8/2013 | Fleck | H10H 20/856 362/249.02 |
| 2013/0285885 | A1 * | 10/2013 | Nowatzyk | G02B 3/0006 345/8 |
| 2017/0133357 | A1 * | 5/2017 | Kuo | H10H 20/856 |
| 2018/0003981 | A1 | 1/2018 | Urey | |
| 2018/0095195 | A1 * | 4/2018 | Kim | G02B 5/003 |
| 2019/0064532 | A1 * | 2/2019 | Riley, Jr. | G02B 27/0916 |
| 2019/0086674 | A1 * | 3/2019 | Sinay | G02B 27/0172 |
| 2019/0121136 | A1 * | 4/2019 | Pierer | H01S 5/4093 |
| 2019/0121141 | A1 * | 4/2019 | Dykaar | H01S 5/4075 |
| 2019/0171018 | A1 * | 6/2019 | Pierer | G02B 27/0172 |
| 2019/0179151 | A1 * | 6/2019 | Pierer | H01S 5/4093 |
| 2019/0196201 | A1 * | 6/2019 | Pierer | H01S 5/4093 |
| 2019/0196207 | A1 * | 6/2019 | Pierer | G02B 27/0172 |
| 2019/0229495 | A1 * | 7/2019 | Pierer | G02B 27/01 |
| 2020/0026080 | A1 * | 1/2020 | Pierer | H01S 5/023 |
| 2020/0049979 | A1 * | 2/2020 | Brennan | G02B 6/0016 |
| 2020/0135703 | A1 * | 4/2020 | Ahmed | H10W 90/00 |
| 2020/0327842 | A1 | 10/2020 | Buckley | |
| 2020/0395503 | A1 * | 12/2020 | Wu | H10H 20/01 |
| 2021/0151649 | A1 * | 5/2021 | Goward | H10H 20/857 |
| 2021/0165318 | A1 * | 6/2021 | Pendse | G02B 7/003 |
| 2021/0167268 | A1 * | 6/2021 | Pendse | H10H 20/8583 |
| 2021/0175216 | A1 * | 6/2021 | Pendse | G02B 27/0172 |
| 2022/0026720 | A1 | 1/2022 | Jamali et al. | |
| 2022/0043308 | A1 | 2/2022 | You et al. | |
| 2022/0110522 | A1 | 4/2022 | Hu et al. | |
| 2022/0146079 | A1 * | 5/2022 | Tamma | G02B 27/0172 |
| 2022/0243876 | A1 | 8/2022 | Pahlevaninezhad et al. | |
| 2022/0283439 | A1 * | 9/2022 | Hong | G02B 27/0172 |
| 2022/0404618 | A1 * | 12/2022 | Klug | G02B 13/16 |
| 2023/0021670 | A1 | 1/2023 | Gollier et al. | |
| 2023/0163262 | A1 * | 5/2023 | Antoniadis | G02B 1/002 257/89 |
| 2023/0236414 | A1 * | 7/2023 | Qiu | G02B 1/002 428/172 |
| 2023/0273434 | A1 * | 8/2023 | Vinish | G02B 27/0172 359/359 |
| 2024/0210695 | A1 * | 6/2024 | Sacher | G02B 27/0172 |
| 2024/0219999 | A1 * | 7/2024 | Fischer | G06F 3/011 |
| 2024/0257677 | A1 * | 8/2024 | Grafenburg | G09G 3/003 |
| 2024/0385447 | A1 * | 11/2024 | Wang | G02B 27/01 |
| 2026/0050190 | A1 * | 2/2026 | Boutami | G02F 1/13362 |

FOREIGN PATENT DOCUMENTS

| | | | | |
|---|---|---|---|---|
| CN | 113589527 A * | 11/2021 | G02B 27/017 |
| CN | 114341674 | 4/2022 | |
| CN | 115016213 | 9/2022 | |
| CN | 115016213 A * | 9/2022 | G03B 21/204 |
| GB | 2622446 A * | 3/2024 | G02B 27/1006 |
| TW | 200504634 | 2/2005 | |
| TW | 200736659 | 10/2007 | |
| TW | 202304035 | 1/2023 | |
| WO | 2022103599 | 5/2022 | |

OTHER PUBLICATIONS

Machine translation of CN-113589527-A (Year: 2021).*
Machine translation of CN-115016213-A (Year: 2022).*
Machine translation of GB-2622446-A (Year: 2024).*
"Office Action of Taiwan Counterpart Application", issued on Sep. 30, 2024, p. 1-p. 23.
"Notice of Allowance of Taiwan Counterpart Application," issued on Jun. 10, 2026, p. 1-p. 3, in which the listed reference was/references were cited.

* cited by examiner

OPTICAL MODULES CONFIGURED TO GENERATE AN ILLUMINATION LIGHT BEAM FROM OVERLAPPING RED/GREEN/BLUE LIGHT SPOTS AND NEAR-EYE DISPLAY USING THE SAME

CROSS-REFERENCE TO RELATED APPLICATION

This application claims the priority benefit of U.S. Provisional Application No. 63/482,302, filed on Jan. 31, 2023 and Taiwan application Ser. No. 112148654, filed on Dec. 14, 2023. The entirety of each of the above-mentioned patent applications is hereby incorporated by reference herein and made a part of this specification.

TECHNICAL FIELD

The disclosure relates to an optical module and a near-eye display.

BACKGROUND

In recent years, head-mounted display (HMD) devices, such as augmented reality (AR), mixed reality (MR), and virtual reality (VR) displays, have gradually become popular in the market. Owing to the advantages of miniaturization and high efficiency of the laser display technology and the advantages of semiconductor packaging of light chips, the laser display technology has begun to be applied to the HMD devices.

However, the existing implementation of the laser display technology relies on independent elements, including edge-emitting lasers, reflectors, collimators, prisms, and light valves. The assembly of the elements results in a sizable light source module, demanding high precision during assembly and incurring substantial costs.

Moreover, the existing laser display technology provides display specifications at 720p and 30 fps. Nonetheless, the industry standard is shifting towards 4 k resolution and higher refresh rates, such as 240 fps, for display devices.

Besides, if interactive interfaces including eye tracking and face tracking are intended to be applied, the conventional approach in the existing HMD devices involves the use of independent cameras as sensing devices, and such a practice contributes to an increase in system volume.

SUMMARY

The disclosure provides an optical module and a near-eye display using the optical module which may effectively reduce the system volume.

An embodiment of the disclosure provides an optical module that is configured to generate an illumination light beam and includes a red light emitting chip array, a green light emitting chip array, a blue light emitting chip array, and a flat optical element. The red light emitting chip array includes a plurality of independently driven red light emitting chips, where each of the red light emitting chips is configured to emit a red light. The green light emitting chip array includes a plurality of independently driven green light emitting chips, where each of the green light emitting chips is configured to emit a green light. The blue light emitting chip array includes a plurality of independently driven blue light emitting chips, where each of the blue light emitting chips is configured to emit a blue light. After passing through the flat optical element, the red lights, the green lights, and the blue lights form a plurality of light spots. Each of the light spots includes a red light spot, a green light spot, and a blue light spot formed after one of the red lights, one of the green lights, and one of the blue lights pass through the flat optical element. The red lights, the green lights, and the blue lights pass through the flat optical element to form the illumination light beam.

Based on the above, in an embodiment of the disclosure, the optical module or the near-eye display using the optical module includes the red light emitting chip array, the green light emitting chip array, the blue light emitting chip array, and the flat optical element. The red, green, and blue light lights emitted by the red, green, and blue light emitting chip arrays form the light spots after passing through the flat optical element. Each light spot includes the red, green, and blue light spots formed by one of the red lights, one of the green lights, and one of the blue lights which pass through the flat optical element. Therefore, the optical module has the simplified module design and the reduced volume, requires lower assembly precision, and reduces costs. Moreover, the near-eye display using the optical module provided in one or more embodiments of the disclosure may achieve a high refresh rate of the display frame by taking advantage of the fast response speed of the light emitting chip. Besides, the optical system may use a plurality of the optical modules to generate the display frame, and thus the resultant display frame has the high resolution.

DETAILED DESCRIPTION OF DISCLOSED EMBODIMENTS

Figure 1A:
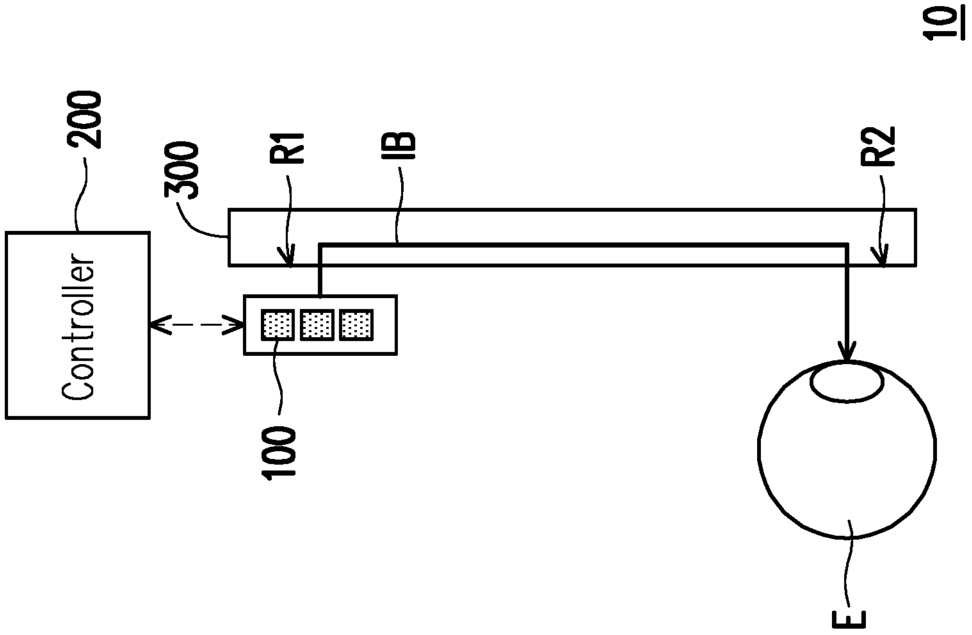
FIG. 1A is a schematic view of a near-eye display according to an embodiment of the disclosure.

FIG. 1A is a schematic view of a near-eye display according to an embodiment of the disclosure. With reference to FIG. 1A, an embodiment of the disclosure provides a near-eye display 10, which includes a plurality of optical modules 100, a controller 200, and a waveguide combiner 300.

In this embodiment, the optical modules 100 are configured to generate illumination light beams IL. The controller 200 is electrically connected to the optical modules 100 and is configured to convert the illumination light beams IL into a plurality of image light beams IB. The waveguide combiner 300 has a light entrance region R1 and a light exit region R2. The optical modules 100 are disposed next to the light entrance region R1. After the light entrance region R1 receives the image light beams IB, the waveguide combiner 300 transmits the image light beams IB to the light exit region R2, and the image light beams IB are then emitted from the light exit region R2.

For instance, the image light beams IB are transmitted by the waveguide combiner 300 and enter eyes E of a viewer. Each illumination light beam IL generated by the optical modules 100 corresponds to a portion of an image that can be seen by the eyes E, e.g., corresponding to 10×10 pixels, which should however not be construed as a limitation in the disclosure. That is, the illumination light beams IL generated by the optical modules 100 are converted into the image light beams IB, and the image light beams IB are combined to form the image that can be seen by the eyes E. The controller 200 may control the intensity of each illumination light beam IL generated by the optical modules 100 to convert the illumination light beams IL into the image light beams IB. In another embodiment, the controller 200 may control a light valve (such as a light valve 400' shown in FIG. 9) to convert the illumination light beams IL into the image light beams IB.

In an embodiment, the controller 200 may include a central processing unit (CPU), a microprocessor, a digital signal processor (DSP), a programmable controller, a programmable logic device (PLD), any other similar device, or a combination of these devices, which should however not be construed as a limitation in the disclosure. Besides, in an embodiment, the various functions of the controller 200 may be implemented in form of a plurality of programming codes. The programming codes are stored in a memory unit and executed by the controller 200. Alternatively, in an embodiment, the various functions of the controller 200 may be implemented in form of one or more circuits, and whether the various functions of the controller 200 are implemented in form of software or hardware is not limited in the disclosure.

Figure 1B:
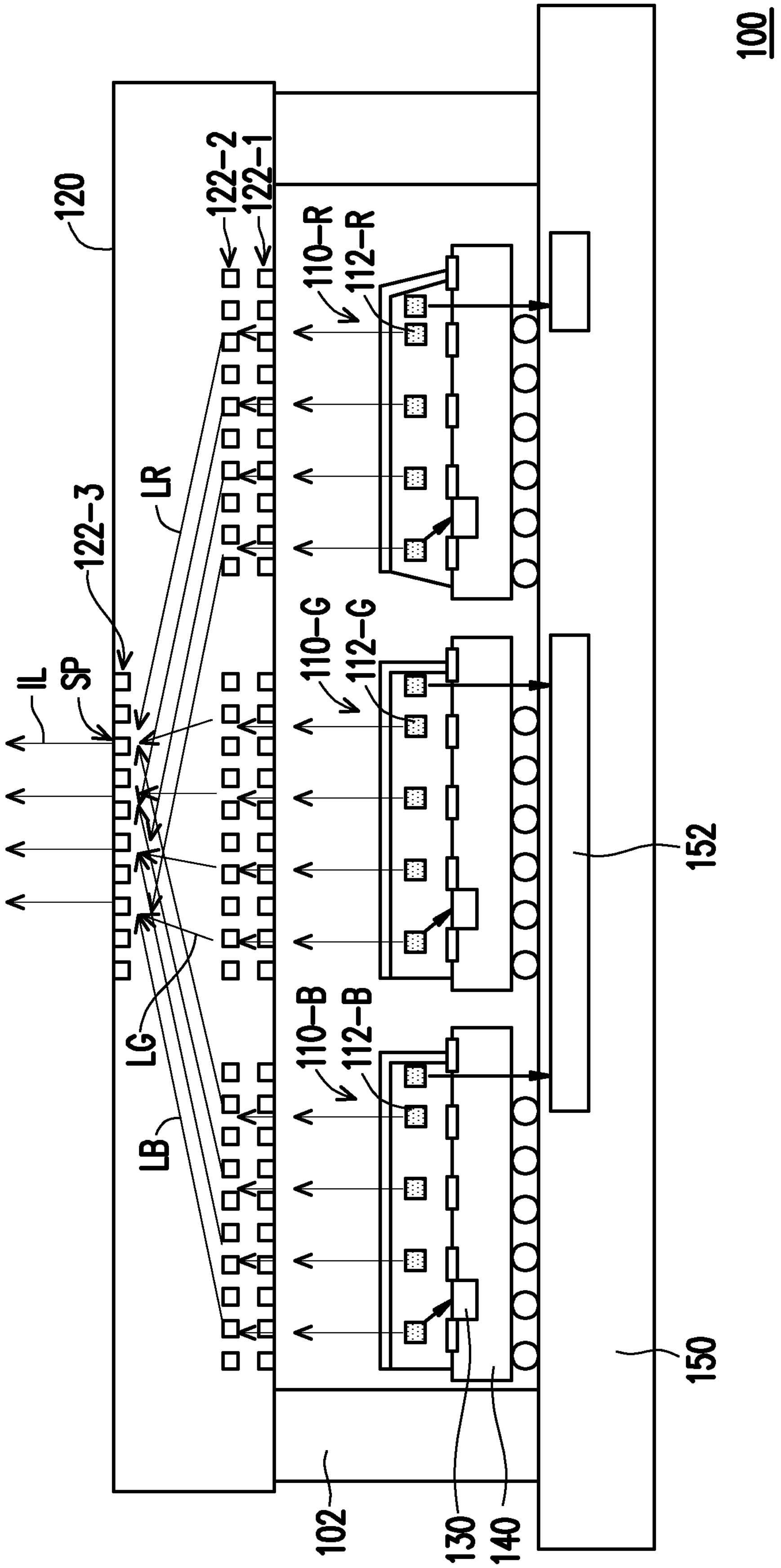
FIG. 1B is a schematic view of an optical module according to a first embodiment of the disclosure.

FIG. 1B is a schematic view of an optical module according to a first embodiment of the disclosure. With reference to FIG. 1B, in this embodiment, the optical module 100 includes a red light emitting chip array 110-R, a green light emitting chip array 110-G, a blue light emitting chip array 110-B, and a flat optical element 120. The red light emitting chip array 110-R includes a plurality of independently driven red light emitting chips 112-R, each of which is configured to emit a red light LR. The green light emitting chip array 110-G includes a plurality of independently driven green light emitting chips 112-G, each of which is configured to emit a green light LG. The blue light emitting chip array 110-B includes a plurality of independently driven blue light emitting chips 112-B, each of which is configured to emit a blue light LB. The red, green, and blue lights LR, LG, and LB form a plurality of light spots SP after passing through the flat optical element 120. Each light spot SP includes a red light spot, a green light spot, and a blue light spot that are respectively formed by one of the red lights LR, one of the green lights LG, and one of the blue lights LB passing through the flat optical element 120. The red, green, and blue lights LR, LG, and LB form an illumination light beam IL after passing through the flat optical element 120.

In this embodiment, the red, green, or blue light emitting chips 112-R, 112-G, or 112-B may be vertical-cavity surface-emitting laser (VCSEL) chips, micro light emitting diode (Micro LED) chips, or micro organic light emitting diode (Micro OLED) chips.

In this embodiment, the flat optical element 120 includes a plurality of stacked metasurfaces 122-1, 122-2, and 122-3. The metasurfaces 122-1, 122-2, and 122-3 may be formed by a plurality of nanocolumns or nanopores. Each of the metasurfaces 122-1, 122-2, and 122-3 may be designed and formed in response to different functions. The metasurface 122-1 may be configured to collimate light beams, the metasurface 122-2 may be configured to deflect the light beams, and the metasurface 122-3 may be configured to deflect the light beams and eliminate chromatic dispersion.

In this embodiment, the red, green, or blue light emitting chips 112-R, 112-G, or 112-B may be arranged in N*M arrays, where N≥1, and M≥2.

In this embodiment, the optical module 100 further includes a plurality of first sensors 130. The first sensors 130 may be optical sensors, such as complementary metal-oxide semiconductors (CMOS), charge coupled devices (CCD), or photodiodes, which should however not be construed as a limitation in the disclosure. The first sensors 130 are respectively disposed in the red light emitting chip array 110-R, the green light emitting chip array 110-G, and the blue light emitting chip array 110-B, and are configured to sense the red light LR, the green light LG, and the blue light LB which are scattered in the red light emitting chip array 110-R, the green light emitting chip array 110-G, and the blue light emitting chip array 110-B to the first sensors 130. In other words, the intensity of the red light LR, the green light LG, or the blue light LB may be determined by an intensity of signals obtained by the first sensors 130.

In this embodiment, the optical module 100 further includes light emitting chip drivers 140 and a redistribution line (RDL) substrate 150. The light emitting chip drivers 140 are electrically connected to the red light emitting chip array 110-R, the green light emitting chip array 110-G, and the blue light emitting chip array 110-B. The red light emitting chip array 110-R, the green light emitting chip array 110-G, and the blue light emitting chip array 110-B are disposed between the flat optical element 120 and the light emitting chip drivers 140. The RDL substrate 150 is electrically connected to the light emitting chip drivers 140 and is disposed on one side of the light emitting chip drivers 140 opposite to the red light emitting chip array 110-R, the green light emitting chip array 110-G, and the blue light emitting chip array 110-B. In addition, in the optical module 100, in addition to using the RDL substrate 150 to transmit electrical signals, the RDL substrate 150 may include an optical waveguide interconnect structure 152 configured to transmit optical signals between elements in the optical module 100.

In an embodiment, the optical module 100 further includes a plurality of cylinders 102 disposed between the flat optical element 120 and the RDL substrate 150 to form accommodation space between the flat optical element 120 and the RDL substrate 150.

In view of the above, according to an embodiment of the disclosure, the optical module 100 or the near-eye display 10 using the optical modules 100 includes the red light emitting chip array 110-R, the green light emitting chip array 110-G, the blue light emitting chip array 110-B, and the flat optical element 120. The red light emitting chip array 110-R includes the independently driven red light emitting chips 112-R, each of which is configured to emit the red light LR. The green light emitting chip array 110-G includes the independently driven green light emitting chips 112-G, each of which is configured to emit the green light LG. The blue light emitting chip array 110-B includes the independently driven blue light emitting chips 112-B, each of which is configured to emit the blue light LB. The red, green, and blue lights LR, LG, and LB form the light spots SP after passing through the flat optical element 120. Each light spot SP includes the red light spot, the green light spot, and the blue light spot that are formed after one of the red lights LR, one of the green lights LG, and one of the blue lights LB pass through the flat optical element 120. Therefore, the simplified module design of the optical module 100 leads to the reduced volume of the module, requires lower assembly precision, and reduces costs. Besides, the optical system, such as the near-eye display 10, using the optical modules 100 provided in the embodiment of the disclosure, may achieve a high refresh rate effect because of the fast response speed of the light emitting chips. Moreover, the optical system may use a plurality of the optical modules 100 to generate a display frame, and thus the resultant display frame has the high resolution.

Figure 2A:
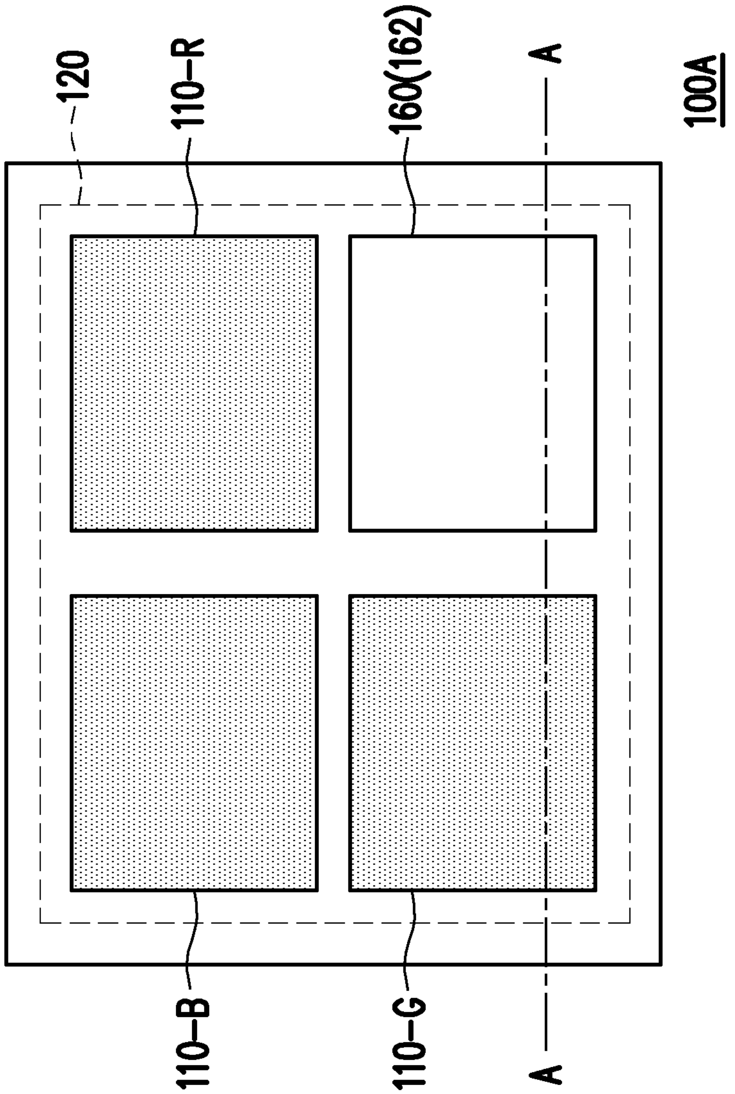
FIG. 2A is a schematic top view of an optical module according to a second embodiment of the disclosure.
Figure 2B:
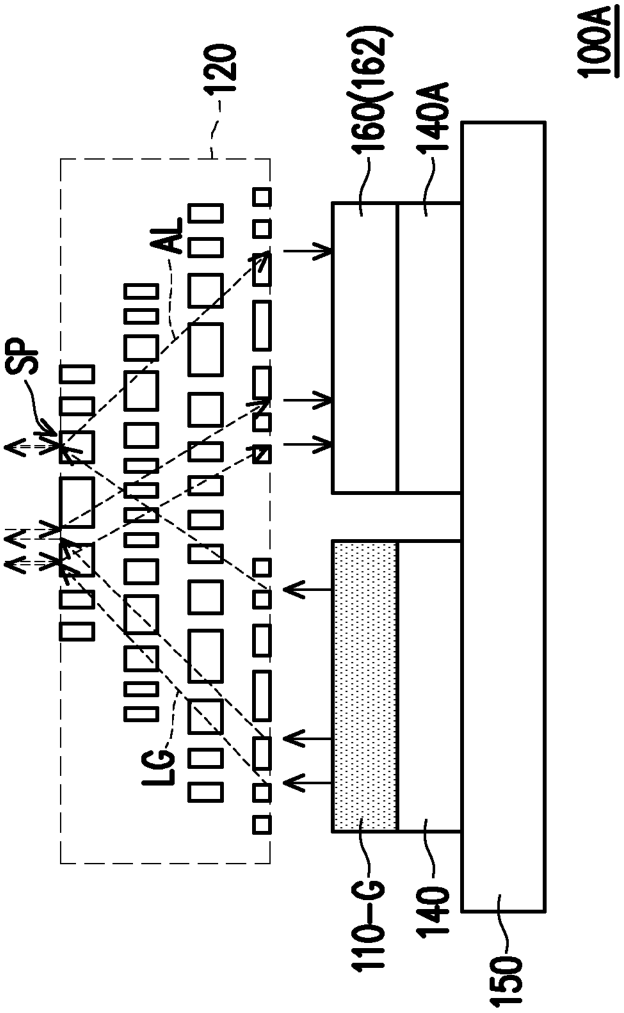
FIG. 2B is a schematic cross-sectional view taken along the sectional line A-A in FIG. 2A.

FIG. 2A is a schematic top view of an optical module according to a second embodiment of the disclosure. FIG. 2B is a schematic cross-sectional view taken along the sectional line A-A in FIG. 2A. With reference to FIG. 2A and FIG. 2B, an optical module 100A depicted in FIG. 2A and FIG. 2B is substantially the same as the optical module 100 depicted in FIG. 1B, while the difference therebetween lies in that the optical module 100A in this embodiment further includes a sensor array 160. The sensor array 160 includes a plurality of independently driven second sensors 162, which may be complementary metal-oxide semiconductors (CMOS), charge coupled devices (CCD), or photodiode, which should however not be construed as a limitation in the disclosure.

In this embodiment, the optical module 100A further includes the light emitting chip driver 140, a sensing chip driver 140A, and the RDL substrate 150. Here, the sensing chip driver 140A is electrically connected to the sensor array 160. The sensor array 160 is disposed between the flat optical element 120 and the sensing chip driver 140A. The RDL substrate 150 is electrically connected to the light emitting chip driver 140 and the sensing chip driver 140A.

Figure 3:
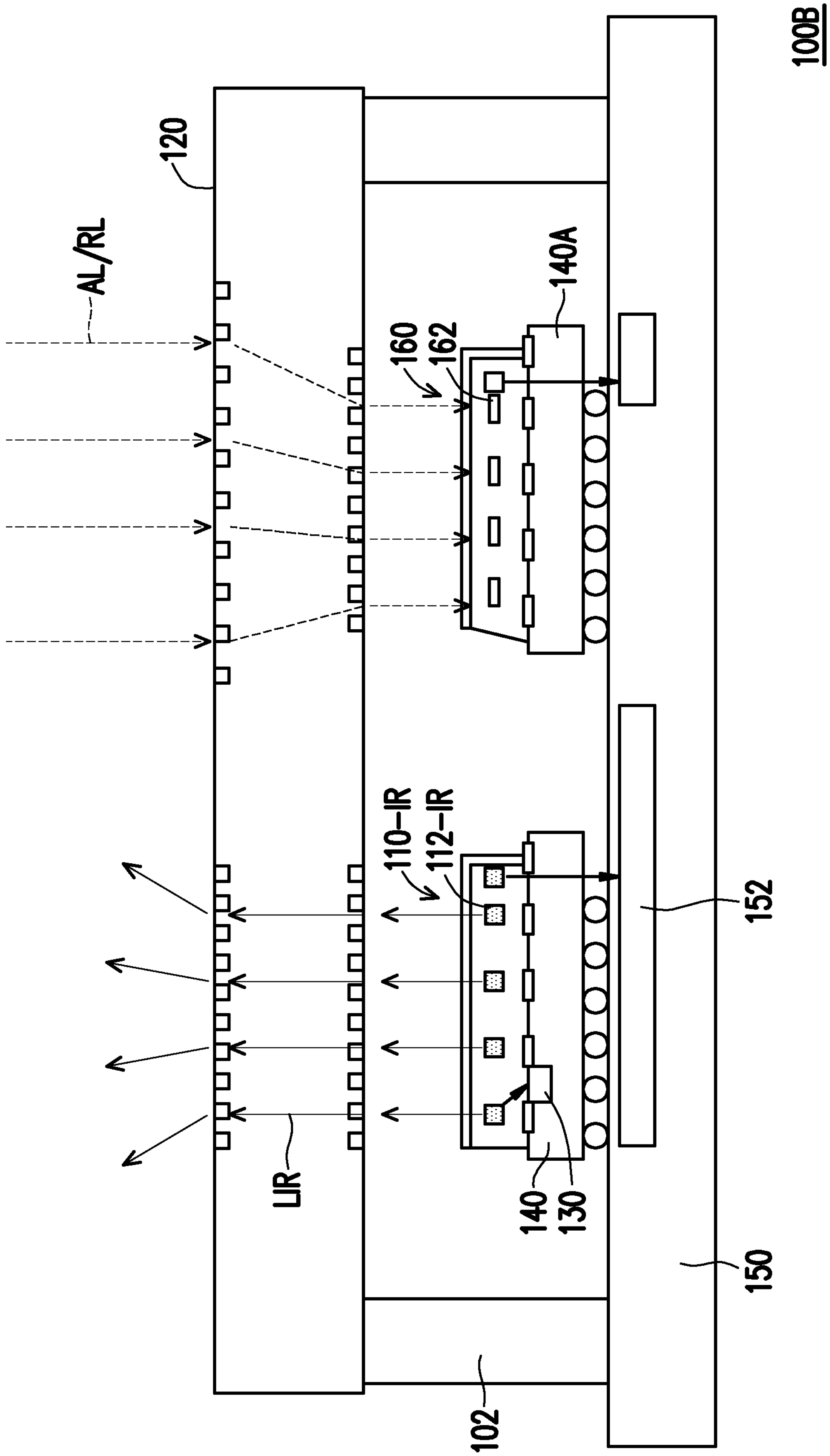
FIG. 3 is a schematic view of an optical module according to a third embodiment of the disclosure.

FIG. 3 is a schematic view of an optical module according to a third embodiment of the disclosure. For better schematic illustrations, an optical module 100B in FIG. 3 omits the depiction of the red light emitting chip array, the green light emitting chip array, or the blue light emitting chip array. With reference to FIG. 3, an optical module 100B depicted in FIG. 3 is substantially the same as the optical module 100 depicted in FIG. 1B or the optical module 100A depicted in FIG. 2B, while the difference therebetween lies in that the optical module 100B provided in this embodiment further includes an infrared light emitting chip array 110-IR. The infrared light emitting chip array 110-IR includes a plurality of independently driven infrared light emitting chips 112-IR. Here, the infrared light emitting chips 112-IR may be VCSEL chips, micro LED chips, or micro OLED chips. The infrared light emitting chips 112-IR are configured to respectively emit infrared lights LIR. The sensor array 160 is configured to receive an ambient light AL or a plurality of reflection lights RL generated by reflecting the infrared lights LIR.

In addition, the first sensors 130 may be disposed in the infrared light emitting chip array 110-IR and configured to sense the infrared lights LIR scattered in the infrared light emitting chip array 110-IR to the first sensors 130.

In an embodiment of the disclosure, in the optical module 100B or the near-eye display 10 using the optical modules 100B, since the optical module 100B further includes the sensor array 160 configured to receive the reflection lights RL generated by reflecting the ambient light AL or the infrared lights LIR, the optical module 100B may be utilized in interactive interfaces, such as eye tracking, face tracking, and so on, and the optical system may still have the advantage of having fewer optical elements.

Figure 4:
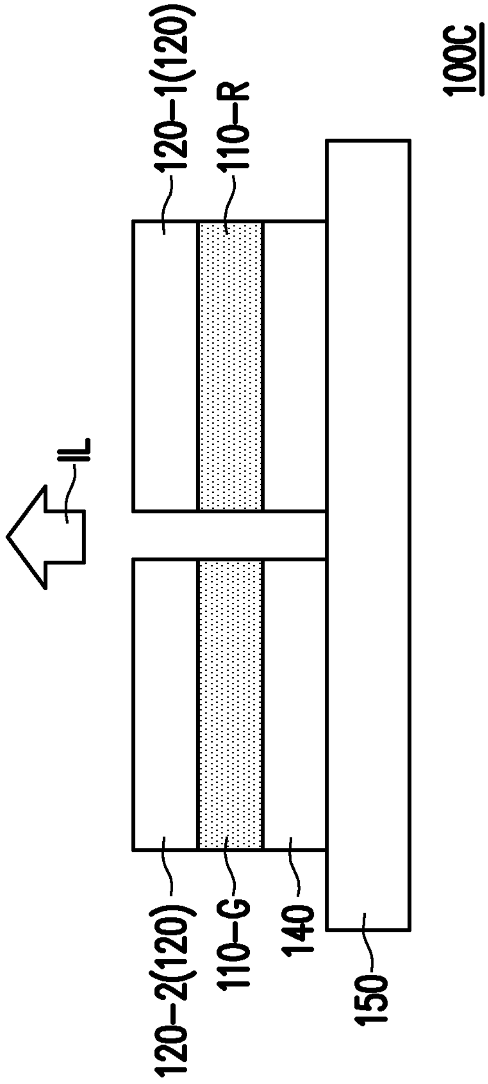
FIG. 4 is a schematic view of an optical module according to a fourth embodiment of the disclosure.

FIG. 4 is a schematic view of an optical module according to a fourth embodiment of the disclosure. With reference to FIG. 4, an optical module 100C depicted in FIG. 4 is substantially the same as the optical module 100 depicted in FIG. 1B, while the difference therebetween lies in that the flat optical element 120 provided in this embodiment includes a plurality of sub-flat optical elements 120-1 and 120-2 which are disposed on optical paths of the red lights LR, the green lights LG, and the blue lights LB, respectively. That is, one of the red lights LR, one of the green lights LG, and one of the blue lights LB, although passing through different sub-flat optical elements 120-1 and 120-2, may converge to the same light spot SP outside the sub-flat optical elements 120-1 and 120-2 to generate an illumination light beam IL, as shown in FIG. 1B, which should however not be construed as a limitation in the disclosure. The sub-flat optical elements 120-1 and 120-2 may be designed in a manner similar to the manner in which the flat optical element 120 is design and may be designed for achieving different functions, such as light beam collimation, light beam deflection, and light beam deflection during chromaticity elimination.

Figure 5:
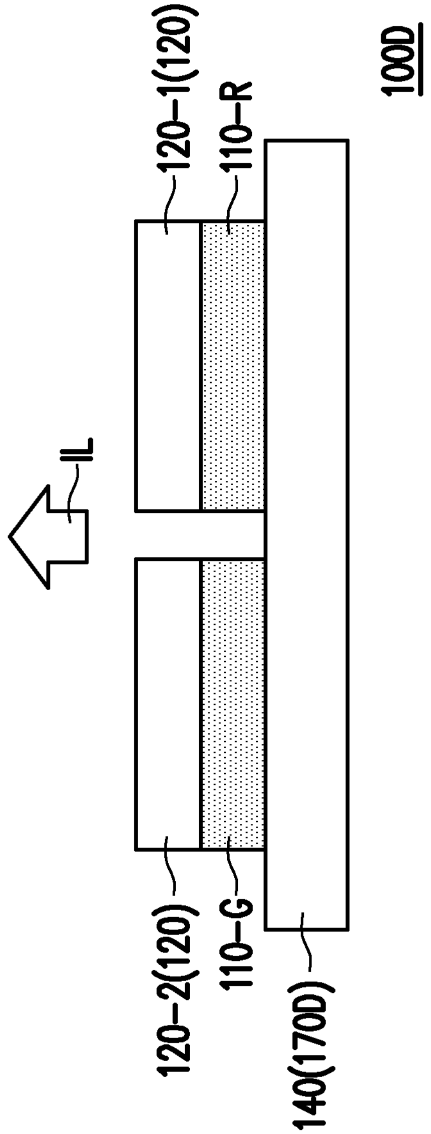
FIG. 5 is a schematic view of an optical module according to a fifth embodiment of the disclosure.

FIG. 5 is a schematic view of an optical module according to a fifth embodiment of the disclosure. With reference to FIG. 5, an optical module 100D depicted in FIG. 5 is substantially the same as the optical module 100 depicted in FIG. 1B, while the difference therebetween lies in that the optical module 100D provided in this embodiment further includes a transparent substrate 170D. The transparent substrate 170D includes a light emitting chip driver 140. The light emitting chip driver 140 is electrically connected to the red light emitting chip array 110-R, the green light emitting chip array 110-G, and the blue light emitting chip array 110-B. The red light emitting chip array 110-R, the green light emitting chip array 110-G, and the blue light emitting chip array 110-B are disposed between the flat optical element 120 and the transparent substrate 170D. Therefore, the number of elements in the optical module 100D may be further reduced.

Figure 6:
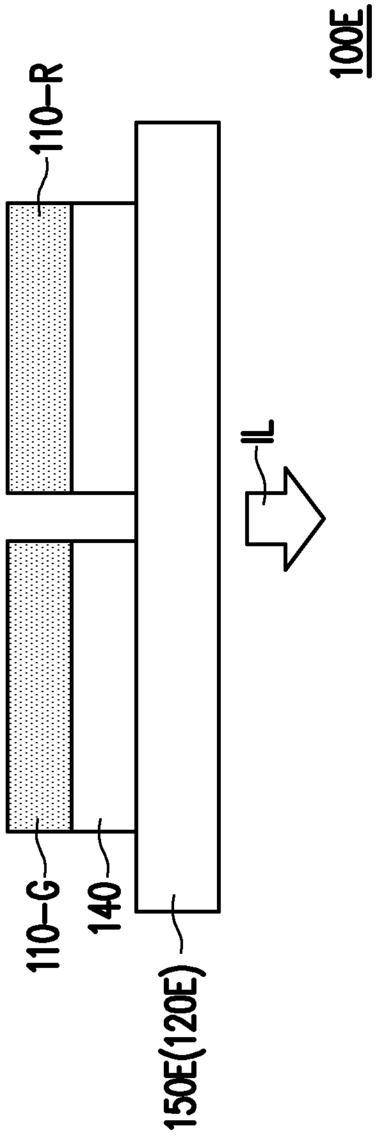
FIG. 6 is a schematic view of an optical module according to a sixth embodiment of the disclosure.

FIG. 6 is a schematic view of an optical module according to a sixth embodiment of the disclosure. With reference to FIG. 6, an optical module 100E depicted in FIG. 6 is substantially the same as the optical module 100 depicted in FIG. 1B, while the difference therebetween lies in that the optical module 100E provided in this embodiment further includes a light emitting chip driver 140. The light emitting chip driver 140 is electrically connected to the red light emitting chip array 110-R, the green light emitting chip array 110-G, and the blue light emitting chip array 110-B. A flat optical element 120E includes a RDL structure 150E. The RDL structure 150E is electrically connected to the light emitting chip driver 140. After being emitted from the red, green, and blue light emitting chip arrays 110-R, 110-G, and 110-B, the red, green, and blue lights LR, LG, and LB pass through the light emitting chip driver 140 before the red, green, and blue lights LR, LG, and LB are transmitted to the flat optical element 120E.

Figure 7:
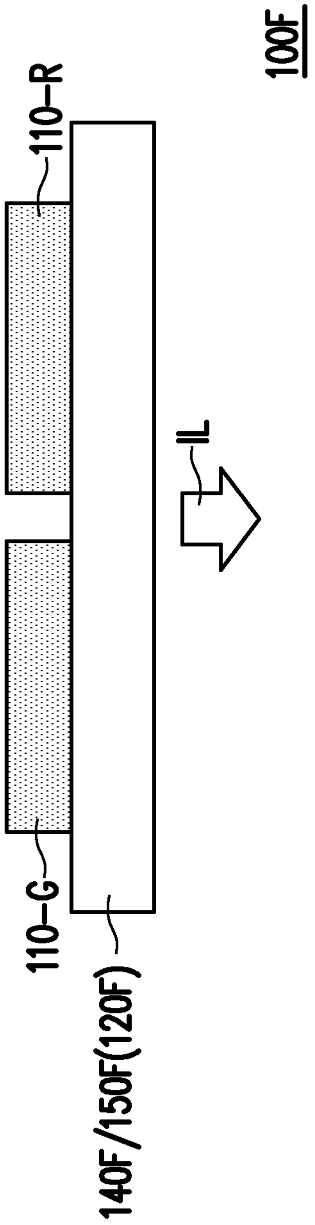
FIG. 7 is a schematic view of an optical module according to a seventh embodiment of the disclosure.

FIG. 7 is a schematic view of an optical module according to a seventh embodiment of the disclosure. With reference to FIG. 7, an optical module 100F depicted in FIG. 7 is substantially the same as the optical module 100 depicted in FIG. 1B, while the difference therebetween lies in that a flat optical element 120F provided in this embodiment includes a RDL structure 150F and a light emitting chip driver 140F. The light emitting chip driver 140F is electrically connected to the red light emitting chip array 110-R, the green light emitting chip array 110-G, and the blue light emitting chip array 110-B, and the RDL structure 150F is electrically connected to the light emitting chip driver 140F.

Figure 8A:
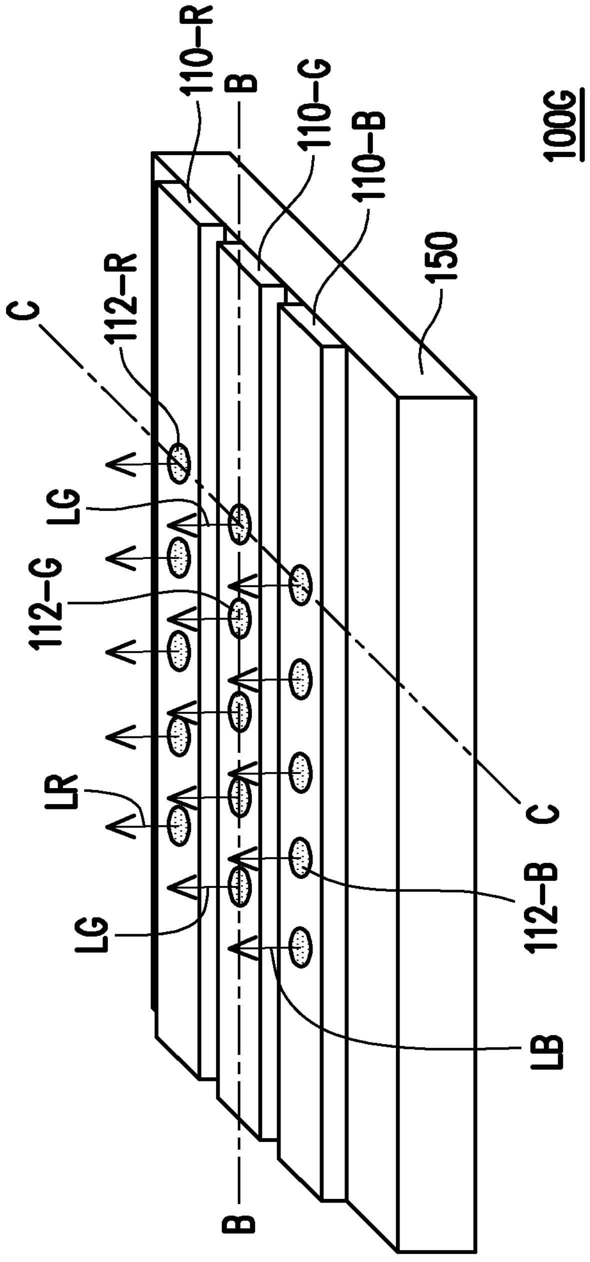
FIG. 8A is a schematic view of an optical module according to an eighth embodiment of the disclosure.
Figure 8B:
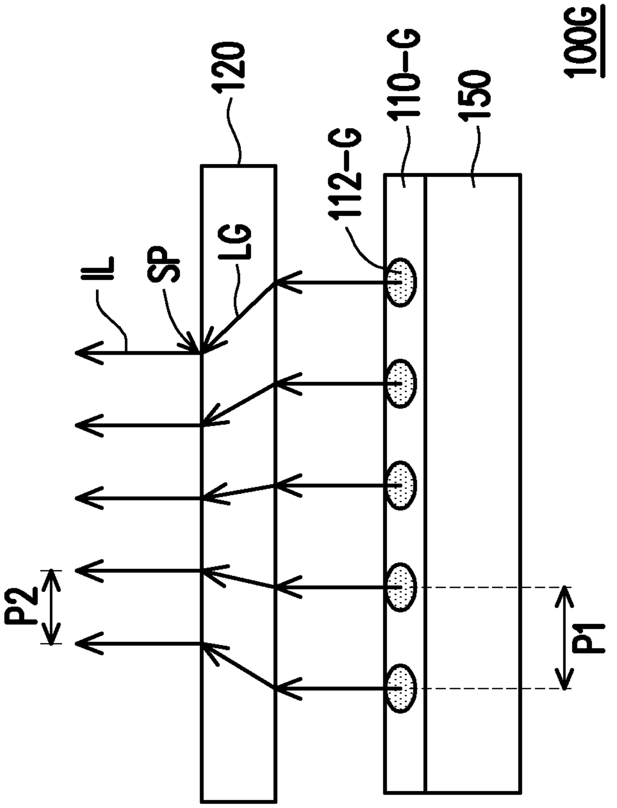
FIG. 8B is a schematic cross-sectional view taken along the sectional line B-B in FIG. 8A.
Figure 8C:
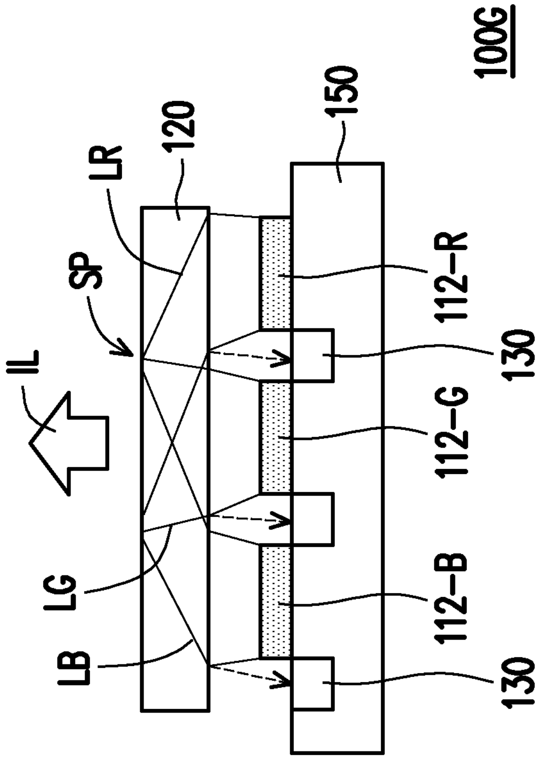
FIG. 8C is a schematic cross-sectional view taken along the sectional line C-C in FIG. 8A.

FIG. 8A is a schematic view of an optical module according to an eighth embodiment of the disclosure. FIG. 8B is a schematic cross-sectional view taken along the sectional line B-B in FIG. 8A. FIG. 8C is a schematic cross-sectional view taken along the sectional line C-C in FIG. 8A. With reference to FIG. 8A to FIG. 8C, an optical module 100G depicted in FIG. 8A to FIG. 8C is substantially the same as the optical module 100 depicted in FIG. 1B, while the difference therebetween lies in that the red light emitting chips 112-R, the green light emitting chips 112-G, and the blue light emitting chips 112-B provided in this embodiment are arranged in 1×M arrays, where M≥2. Moreover, a pitch between the red light emitting chips 112-R, a pitch between the green light emitting chips 112-G, or a pitch between the blue light emitting chips 112-B is P1. A pitch between the light spots SP formed after the red light LRs, the green lights LG, or the blue lights LB pass through the flat optical element 120 is P2, and P2<P1.

Figure 9:
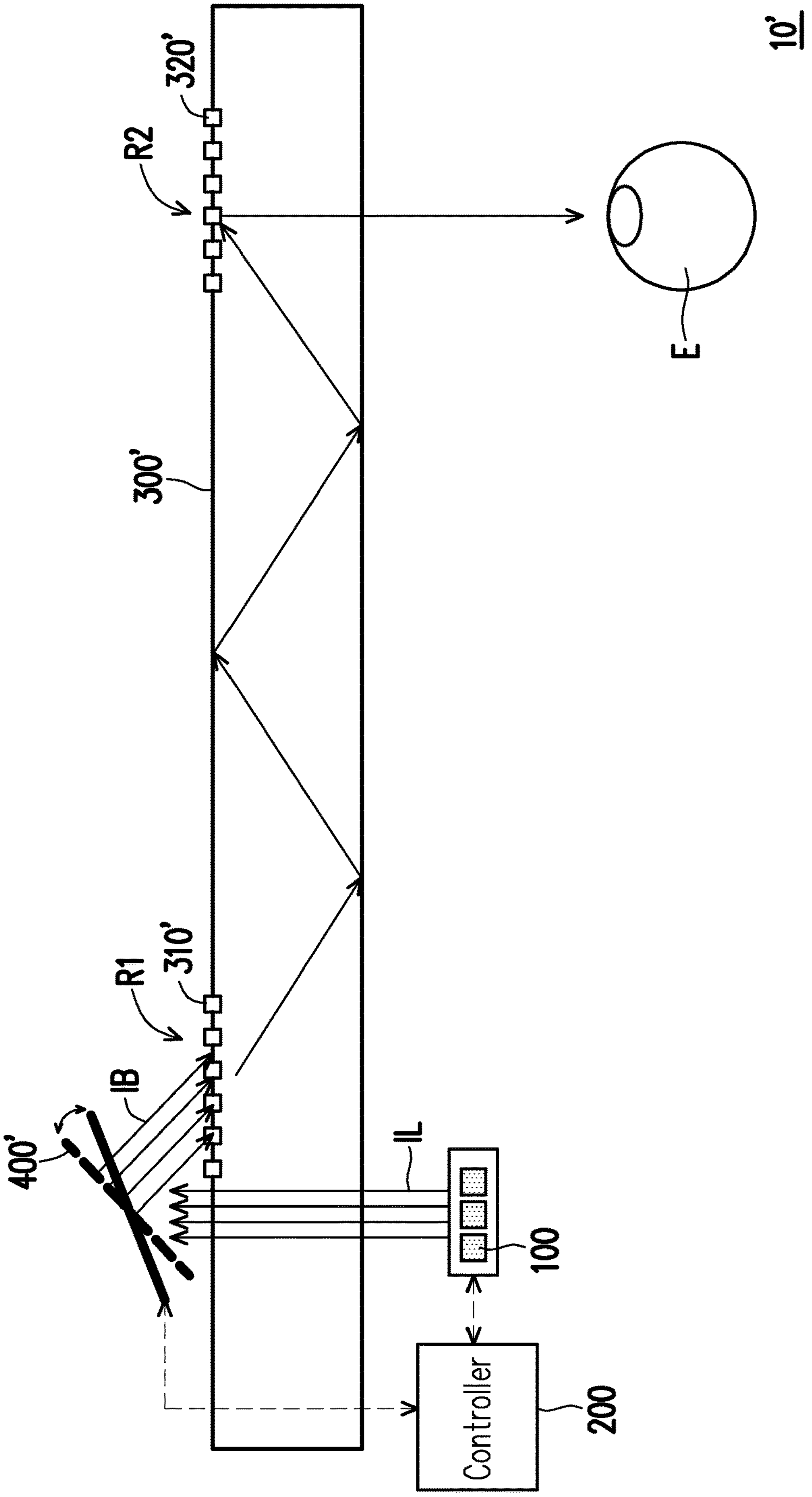
FIG. 9 is a schematic view of a near-eye display according to another embodiment of the disclosure.

FIG. 9 is a schematic view of a near-eye display according to another embodiment of the disclosure. With reference to FIG. 9, a near-eye display 10' depicted in FIG. 9 is substantially the same as the near-eye display 10, while the difference therebetween lies in that the near-eye display 10' provided in this embodiment further includes a light valve 400'. The light valve 400' may be a reflective light modulator such as a liquid crystal on silicon (LCoS) panel, a digital micro-mirror device (DMD), and so on. In some embodiments, the light valve may also be a transmissive light modulator, such as a transparent liquid crystal panel, an electro-optical modulator, a magneto-optic modulator, an acousto-optic modulator (AOM), a micro-electromechanical system (MEMS) scanning mirror, and so on.

In this embodiment, the light valve 400' is disposed on one side of a waveguide combiner 300' opposite to the optical modules 100 and is configured to convert the illumination light beams IL into the image light beams IB. After being emitted from the optical modules 100, the illumination light beams IL pass through the waveguide combiner 300' and are then transmitted to the light valve 400'.

In this embodiment, the waveguide combiner 300' includes first grating couplers 310' and second grating couplers 320'. The first grating couplers 310' are disposed at the light entrance region R1 and configured to receive the image light beams IB, allowing the image light beams IB to enter the waveguide combiner 300'. The second grating couplers 320' are disposed at the light exit region R2 and configured to allow the image light beams IB, which are transmitted in the waveguide combiner 300', to be emitted from the light exit region R2.

Figure 10:
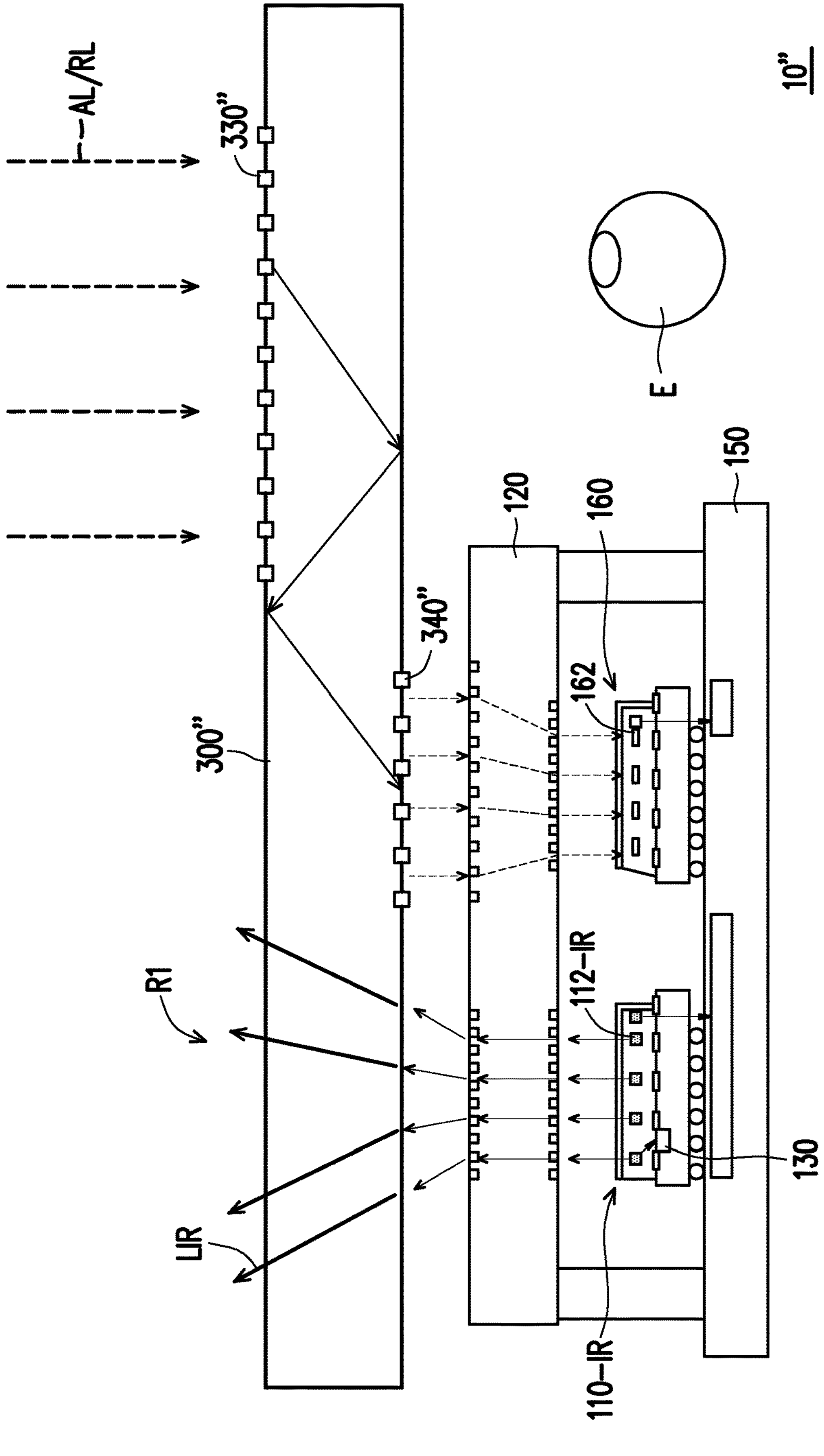
FIG. 10 is a schematic view of a near-eye display according to yet another embodiment of the disclosure.

FIG. 10 is a schematic view of a near-eye display according to yet another embodiment of the disclosure. Here, for better schematic illustrations, FIG. 10 omits the depictions of the optical module 100 and the controller 200 shown in FIG. 1A or FIG. 9, and the waveguide combiner 300' in FIG. 9 omits the illustrations of the light entrance region R1 and the light exit region R2 of the waveguide combiner 300 or 300'. With reference to FIG. 10, a near-eye display 10" depicted in FIG. 10 is substantially the same as the near-eye display 10 depicted in FIG. 1A or the near-eye display 10' depicted in FIG. 9, while the difference therebetween lies in that the near-eye display 10" provided in this embodiment includes a plurality of the optical modules 100, the controller 200, the infrared light emitting chip array 110-IR, the sensor array 160, and a waveguide combiner 300". The infrared light emitting chip array 110-IR is electrically connected to the controller 200. The infrared light emitting chip array 110-IR includes a plurality of independently driven infrared light emitting chips 112-IR, each of which is configured to emit the infrared light LIR. The sensor array 160 is electrically connected to the controller 200. The sensor array 160 includes a plurality of independently driven second sensors 162 configured to sense the ambient light AL or a plurality of reflection lights RL generated by reflecting the infrared lights LIR. The optical module 100, the infrared light emitting chip array 110-IR, and the sensor array 160 are disposed on one side of the waveguide combiner 300". After entering the waveguide combiner 300" from the one side of the waveguide combiner 300", the infrared lights LIR is transmitted in the waveguide combiner 300" and exits from the other side of the waveguide combiner 300". After entering the waveguide combiner 300" from the other side of the waveguide combiner 300", the ambient light AL or the reflection lights RL are transmitted in the waveguide combiner 300" and then emitted from the one side of the waveguide combiner 300" and transmitted to the sensor array 160.

In this embodiment, the waveguide combiner 300" includes third grating couplers 330" and fourth grating couplers 340". The third grating couplers 330" are configured to receive the ambient light AL or the reflection lights RL generated by reflecting the infrared lights LIR. The fourth grating couplers 340" are disposed at the light entrance region R1 and configured to allow the ambient light AL or the reflection lights RL transmitted in the waveguide combiner 300" to exit from the light entrance region R1. The fourth grating couplers 340" are aligned with the sensor array 160, allowing the ambient light AL or the reflection lights RL to enter the sensor array 160.

In addition, in another embodiment, (another) flat optical element 120, e.g., the flat optical element shown in FIG. 10, may be disposed between the infrared light emitting chip array 110-IR or the sensor array 160 and the waveguide combiner 300", so that the infrared lights LIR are allowed to enter the waveguide combiner 300" in adjusted light patterns and then emitted out, and the ambient light AL or the reflection lights RL are allowed to be better concentrated to the sensor array 160.

Figure 11:
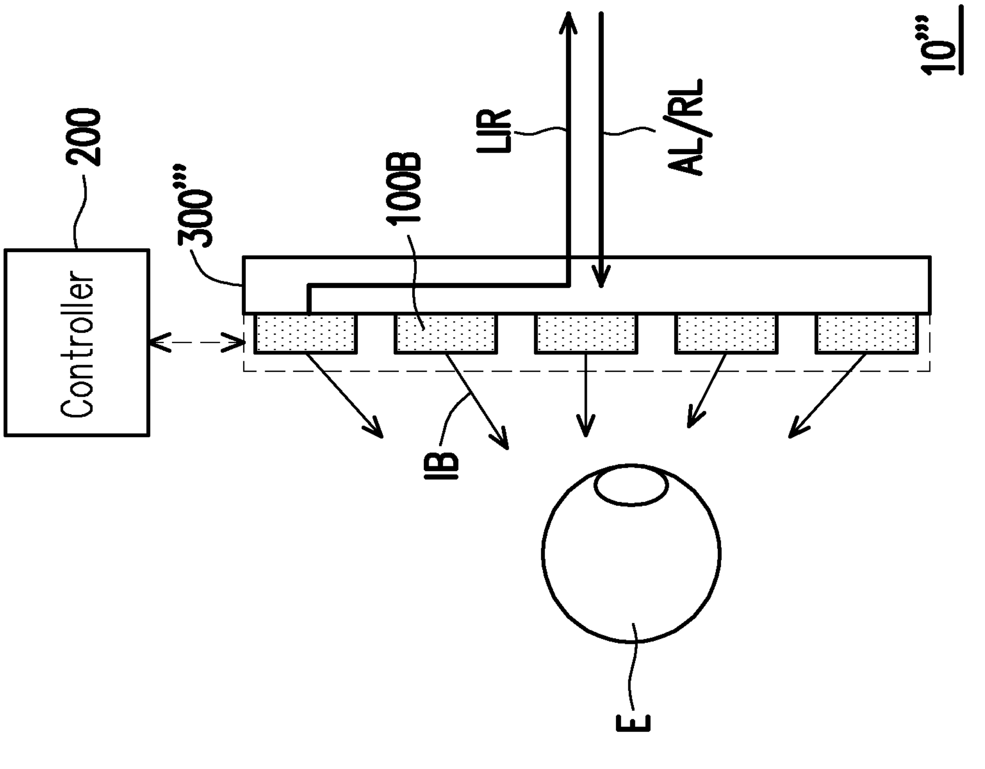
FIG. 11 is a schematic view of a near-eye display according to still yet another embodiment of the disclosure.

FIG. 11 is a schematic view of a near-eye display according to still yet another embodiment of the disclosure. With reference to FIG. 11, a near-eye display 10" depicted in FIG. 11 is substantially similar to the near-eye display 10 depicted in FIG. 1A, while the difference therebetween lies in that the near-eye display 10'" provided in this embodiment includes the optical modules 100B, the controller 200, and a waveguide combiner 300'". The optical modules 100B are disposed on one side of the waveguide combiner 300" The image light beams IB are emitted in a direction opposite to the waveguide combiner 300" After entering the waveguide combiner 300" from the one side of the waveguide combiner 300", the infrared lights LIR are transmitted in the waveguide combiner 300' and then exit from the other side of the waveguide combiner 300'". After entering the waveguide combiner 300" from the other side, the ambient light AL or the reflection lights RL are transmitted in the waveguide combiner 300", exit from the one side, and are transmitted to the sensor array 160.

To sum up, according to one or more embodiments of the disclosure, the optical module or the near-eye display using the optical modules includes the red light emitting chip array, the green light emitting chip array, the blue light emitting chip array, and the flat optical element. The red light emitting chip array is configured to emit the red light. The green light emitting chip array is configured to emit the green light. The blue light emitting chip array is configured to emit the blue light. The red, green, and blue lights form the light spots after passing through the flat optical element. Each light spot includes the red light spot, the green light spot, and the blue light spot that are formed after one of the red lights, one of the green lights, and one of the blue lights pass through the flat optical element. Therefore, the simplified module design of the optical module leads to the reduced volume of the module, requires lower assembly precision, and reduces costs. Besides, the optical system, such as the near-eye display, using the optical modules provided in one or more embodiments of the disclosure, may achieve a high refresh rate effect because of the fast response speed of the light emitting chips. Moreover, the optical system may use a plurality of the optical modules to generate a display frame, and thus the resultant display frame has the high resolution.

What is claimed is:

1. An optical module, configured to generate an illumination light beam and comprising:

a red light emitting chip array, comprising a plurality of independently driven red light emitting chips, wherein each of the red light emitting chips is configured to emit a red light;

a green light emitting chip array, comprising a plurality of independently driven green light emitting chips, wherein each of the green light emitting chips is configured to emit a green light;

a blue light emitting chip array, comprising a plurality of independently driven blue light emitting chips, wherein each of the blue light emitting chips is configured to emit a blue light; and a flat optical element, disposed on transmission paths of the red lights, the green lights, and blue lights, wherein after passing through the flat optical element, the red lights, the green lights, and the blue lights form a plurality of light spots, each of the light spots comprises a red light spot, a green light spot, and a blue light spot formed after one of the red lights, one of the green lights, and one of the blue lights pass through the flat optical element, and the red light spot, the green light spot and the blue light spot in each of the light spots overlap with each other, wherein the red lights, the green lights, and the blue lights pass through the flat optical element to form the illumination light beam.

2. The optical module according to claim 1, wherein the red light emitting chips, the green light emitting chips, or the blue light emitting chips are vertical-cavity surface-emitting laser chips, micro light emitting diode chips, or micro organic light emitting diode chips.

3. The optical module according to claim 1, wherein the flat optical element comprises a plurality of stacked metasurfaces.

4. The optical module according to claim 1, wherein the red light emitting chips, the green light emitting chips, or the blue light emitting chips are arranged in N*M arrays, wherein N≥1 and M≥2.

5. The optical module according to claim 1, further comprising:

a plurality of first sensors, respectively disposed in the red light emitting chip array, the green light emitting chip array, and the blue light emitting chip array and configured to sense lights scattered to the first sensors from the red lights, the green lights, and the blue lights.

6. The optical module according to claim 1, further comprising:

a light emitting chip driver, electrically connected to the red light emitting chip array, the green light emitting chip array, and the blue light emitting chip array, wherein the red light emitting chip array, the green light emitting chip array, and the blue light emitting chip array are disposed between the flat optical element and the light emitting chip driver; and a redistribution line substrate, electrically connected to the light emitting chip driver and disposed on one side of the light emitting chip driver opposite to the red light emitting chip array, the green light emitting chip array, and the blue light emitting chip array.

7. The optical module according to claim 1, further comprising:

a sensor array, comprising a plurality of independently driven second sensors.

8. The optical module according to claim 7, further comprising:

a light emitting chip driver, electrically connected to the red light emitting chip array, the green light emitting chip array, and the blue light emitting chip array, wherein the red light emitting chip array, the green light emitting chip array, and the blue light emitting chip array are disposed between the flat optical element and the light emitting chip driver;

a sensing chip driver, electrically connected to the sensor array, wherein the sensor array is disposed between the flat optical element and the sensing chip driver; and a redistribution line substrate, electrically connected to the light emitting chip driver and the sensing chip driver and disposed on one side of the light emitting chip driver opposite to the red light emitting chip array, the green light emitting chip array, and the blue light emitting chip array.

9. The optical module according to claim 7, further comprising:

an infrared light emitting chip array, comprising a plurality of independently driven infrared light emitting chips, wherein each of the infrared light emitting chips is configured to emit an infrared light, wherein the sensor array is configured to receive an ambient light or a plurality of reflection lights generated by reflecting the infrared lights.

10. A near-eye display, comprising:

a plurality of optical modules as described in claim 9;

a controller, electrically connected to the optical modules and configured to convert the illumination light beams into a plurality of image light beams; and a waveguide combiner, wherein the optical modules are disposed on one side of the waveguide combiner, wherein the image light beams are emitted in a direction opposite to the waveguide combiner, wherein after entering the waveguide combiner from the one side of the waveguide combiner, the infrared lights are transmitted in the waveguide combiner and emitted from the other side of the waveguide combiner, wherein after entering the waveguide combiner from the other side of the waveguide combiner, the ambient light or the reflection lights are transmitted in the waveguide combiner and emitted from the one side of the waveguide combiner and transmitted to the sensor array.

11. The optical module according to claim 1, wherein the flat optical element comprises a plurality of sub-flat optical elements, the plurality of sub-flat optical elements are respectively disposed on the optical paths of these red lights, these green lights, and these blue lights.

12. The optical module according to claim 1, further comprising:

a transparent substrate, comprising a light emitting chip driver and electrically connected to the red light emitting chip array, the green light emitting chip array, and the blue light emitting chip array, wherein the red light emitting chip array, the green light emitting chip array, and the blue light emitting chip array are disposed between the flat optical element and the transparent substrate.

13. The optical module according to claim 1, further comprising:

a light emitting chip driver, electrically connected to the red light emitting chip array, the green light emitting chip array, and the blue light emitting chip array, wherein the flat optical element comprises a redistribution structure, and the redistribution structure is electrically connected to the light emitting chip driver, wherein after the red lights, the green lights, and the blue lights are respectively emitted from the red light emitting chip array, the green light emitting chip array, and the blue light emitting chip array, the red lights, the green lights, and the blue lights pass through the light emitting chip driver before being transmitted to the flat optical element.

14. The optical module according to claim 1, wherein the flat optical element comprises a redistribution structure and a light emitting chip driver, the light emitting chip driver is electrically connected to the red light emitting chip array, the green light emitting chip array, and the blue light emitting chip array, and the redistribution structure is electrically connected to the light emitting chip driver.

15. The optical module according to claim 1, wherein a pitch between the red light emitting chips, a pitch between the green light emitting chips, or a pitch between the blue light emitting chips is P1, a pitch between the light spots formed after the red lights, the green lights, or the blue lights pass through the flat optical element is P2, and P2<P1.

16. A near-eye display, comprising:

a plurality of the optical modules as described in claim 1;

a controller, electrically connected to the optical modules and configured to convert the illumination light beams into a plurality of image light beams; and a waveguide combiner, having a light entrance region and a light exit region, wherein the optical modules are disposed next to the light entrance region, after the light entrance region receives the image light beams, the waveguide combiner transmits the image light beams to the light exit region, and the image light beams are emitted from the light exit region.

17. The near-eye display according to claim 16, further comprising:

a light valve, disposed on one side of the waveguide combiner opposite to the optical modules and configured to convert the illumination light beams into the image light beams, wherein the illumination light beams pass through the waveguide combiner and are transmitted to the light valve after the illumination light beams are emitted from the optical modules.

18. The near-eye display according to claim 17, wherein the waveguide combiner comprises:

a first grating coupler, disposed at the light entrance region and configured to receive the image light beams to enable the image light beams to enter the waveguide combiner; and a second grating coupler, disposed at the light exit region and configured to emit the image light beams from the light exit region.

19. A near-eye display, comprising:

a plurality of the optical modules as described in claim 1;

a controller, electrically connected to the optical modules and configured to convert the illumination light beams into a plurality of image light beams;

an infrared light emitting chip array, comprising a plurality of independently driven infrared light emitting chips, wherein each of the infrared light emitting chips is configured to emit an infrared light;

a sensor array, comprising a plurality of independently driven second sensors and configured to sense an ambient light or a plurality of reflection lights generated by reflecting the infrared lights; and a waveguide combiner, having a light entrance region and a light exit region, wherein the optical modules, the infrared light emitting chip array, and the sensor array are disposed on one side of the waveguide combiner, the optical modules are disposed next to the light entrance region, after the light entrance region receives the image light beams, the waveguide combiner transmits the image light beams to the light exit region, and the image light beams are emitted from the light exit region, wherein after entering the waveguide combiner from the one side of the waveguide combiner, the infrared lights are transmitted in the waveguide combiner and emitted from the other side of the waveguide combiner, wherein after entering the waveguide combiner from the other side of the waveguide combiner, the ambient light or the reflection lights are transmitted in the waveguide combiner and emitted from the one side of the waveguide combiner and transmitted to the sensor array.

20. The near-eye display according to claim 19, wherein the waveguide combiner comprises:

a third grating coupler, configured to receive the ambient light or the reflection lights generating by reflecting the infrared lights; and a fourth grating coupler, disposed at the light entrance region and configured to emit the ambient light or the reflection lights from the light entrance region, wherein the fourth grating coupler is aligned with the sensor array to enable the ambient light or the reflection lights to enter the sensor array.

* * * * *